United States Patent
Park et al.

(10) Patent No.: US 12,144,201 B2
(45) Date of Patent: Nov. 12, 2024

(54) DISPLAY DEVICE

(71) Applicant: Samsung Display Co., Ltd., Yongin-si (KR)

(72) Inventors: Jin Woo Park, Asan-si (KR); Won Kyu Kwak, Seongnam-si (KR); Dong Wook Kim, Asan-si (KR); Hyun-Chol Bang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/711,598

(22) Filed: Apr. 1, 2022

(65) Prior Publication Data

US 2022/0223660 A1     Jul. 14, 2022

Related U.S. Application Data

(63) Continuation of application No. 16/663,789, filed on Oct. 25, 2019, now Pat. No. 11,296,154.

(30) Foreign Application Priority Data

Oct. 26, 2018 (KR) .......... 10-2018-0129206

(51) Int. Cl.
    *H10K 59/00*     (2023.01)
    *H01L 27/12*     (2006.01)
    (Continued)

(52) U.S. Cl.
    CPC ........... *H10K 59/00* (2023.02); *H10K 59/124* (2023.02); *H10K 59/131* (2023.02);
    (Continued)

(58) Field of Classification Search
    CPC .... H10K 59/00; H10K 59/131; H10K 59/122; H10K 59/124; H10K 50/844; H01L 27/124; H01L 27/1248
    See application file for complete search history.

(56) References Cited

U.S. PATENT DOCUMENTS

| | | | |
|---|---|---|---|
| 9,946,379 | B2 | 4/2018 | Xu et al. |
| 10,268,863 | B2 | 4/2019 | Chan et al. |
| (Continued) | | | |

FOREIGN PATENT DOCUMENTS

| | | |
|---|---|---|
| CN | 104238815 | 12/2014 |
| CN | 107092892 | 8/2017 |
| (Continued) | | |

OTHER PUBLICATIONS

Extended European Search Report corresponding to European Application or Patent No. 19205400.5 dated Apr. 14, 2020.

(Continued)

*Primary Examiner* — Shaun M Campbell
(74) *Attorney, Agent, or Firm* — KILE PARK REED & HOUTTEMAN PLLC

(57) ABSTRACT

A display device includes a display panel including a first region and a second region, and a sensing module on a rear side of the display panel. The first region includes a first pixel area to display an image. The second region includes a second pixel area to display the image and a transmission area to transmit light output by the sensing module. The second region overlaps the sensing module. The second pixel area overlaps a first layer that blocks light output by the sensing module. The transmission area does not overlap the first layer.

10 Claims, 16 Drawing Sheets

(51) Int. Cl.
*H10K 50/844* (2023.01)
*H10K 59/122* (2023.01)
*H10K 59/124* (2023.01)
*H10K 59/131* (2023.01)

(52) U.S. Cl.
CPC ........ *H01L 27/124* (2013.01); *H01L 27/1248* (2013.01); *H10K 50/844* (2023.02); *H10K 59/122* (2023.02)

(56) References Cited

U.S. PATENT DOCUMENTS

| | | | |
|---|---|---|---|
| 10,296,777 | B2 | 5/2019 | Du et al. |
| 10,387,712 | B2 | 8/2019 | Zeng et al. |
| 10,608,058 | B2 | 3/2020 | Gwon et al. |
| 10,627,955 | B2 | 4/2020 | Ko et al. |
| 10,810,397 | B2 | 10/2020 | Zeng et al. |
| 11,296,154 | B2* | 4/2022 | Park ............... G09G 3/3233 |
| 2012/0037912 | A1 | 2/2012 | Kim et al. |
| 2013/0135328 | A1 | 5/2013 | Rappoport et al. |
| 2013/0286335 | A1 | 10/2013 | Onishi |
| 2014/0047706 | A1 | 2/2014 | Shaikh et al. |
| 2015/0187260 | A1 | 7/2015 | Lee et al. |
| 2018/0005006 | A1* | 1/2018 | Chai ............... G06V 40/1318 |
| 2018/0040680 | A1* | 2/2018 | Cai ............... H10K 59/1213 |
| 2018/0069069 | A1* | 3/2018 | Ebisuno ........... H10K 59/352 |
| 2018/0284927 | A1 | 10/2018 | Kim et al. |
| 2018/0373913 | A1* | 12/2018 | Panchawagh ...... G06V 40/1306 |
| 2019/0033976 | A1 | 1/2019 | Cao et al. |
| 2019/0305062 | A1 | 10/2019 | Wang et al. |
| 2020/0019747 | A1* | 1/2020 | Yang ............... G09G 3/3225 |
| 2020/0050818 | A1 | 2/2020 | He et al. |
| 2020/0127224 | A1* | 4/2020 | Kanaya ............ G06F 3/0443 |
| 2020/0236259 | A1* | 7/2020 | Nakamura ......... H10K 59/65 |
| 2020/0312831 | A1 | 10/2020 | He et al. |

FOREIGN PATENT DOCUMENTS

| | | |
|---|---|---|
| CN | 107133613 | 9/2017 |
| CN | 107194321 | 9/2017 |
| CN | 107436685 | 12/2017 |
| CN | 108269503 | 7/2018 |
| CN | 108509899 | 9/2018 |
| KR | 10-2014-0113157 | 9/2014 |
| KR | 10-2016-0002337 | 1/2016 |
| KR | 10-1795428 | 11/2017 |
| KR | 10-2018-0017280 | 2/2018 |
| KR | 10-2018-0088099 | 8/2018 |
| WO | 2014/153523 | 9/2014 |

OTHER PUBLICATIONS

Extended European Search Report for European Application No. 24167456.3, dated Jul. 18, 2024.

* cited by examiner

DISPLAY DEVICE

CROSS-REFERENCE TO RELATED APPLICATION(S)

This is a continuation application of U.S. patent application Ser. No. 16/663,789, filed Oct. 25, 2019, now U.S. Pat. No. 11,269,154 issued on Apr. 5, 2022, the disclosure of which is incorporated herein by reference in its entirety. U.S. patent application Ser. No. 16/663,789 claims priority to and benefit of Korean Patent Application No. 10-2018-0129206 under 35 U.S.C. § 119, filed on Oct. 26, 2018, in the Korean Intellectual Property Office, the entire contents of which are incorporated herein by reference.

BACKGROUND

1. Field

The present disclosure relates to a display device.

2. Description of the Related Art

A light emitting diode display has a self-luminance characteristic, i.e., does not require a separate light source, so a thickness and a weight of the display may be reduced. Further, the light emitting diode display has additional desirable characteristics, e.g., low power consumption, high luminance, high reaction speed, etc. In general, the light emitting diode display includes a substrate, a plurality of transistors on the substrate, and a light-emitting device connected to the transistors.

SUMMARY

An exemplary embodiment provides a display device including: a display panel including a first region and a second region; and a sensing module on a rear side of the display panel. The first region includes a first pixel area to display an image. The second region overlaps the sensing module. The second region includes a second pixel area to display an image and a transmission area to transmit light output by the sensing module. The second pixel area overlaps a first layer that blocks light output by the sensing module and the transmission area does not overlap the first layer.

The second pixel area may include a plurality of transistors, and the first layer may overlap all of the transistors.

The second pixel area may include a plurality of transistors, and the first layer may overlap some of the transistors.

The transmission area may be separated from the first layer in a plan view.

The first pixel area may be separated from the first layer in a plan view.

The first pixel area may overlap the first layer.

The first layer may overlap part of the first pixel area.

The first pixel area may include a plurality of transistors, and the first layer may overlap some of the transistors.

The second pixel area may include a plurality of transistors, and the first layer may overlap at least one of the transistors.

The first pixel area may not overlap the first layer.

The first pixel area may include the first layer overlapping some of a plurality of transistors, and the second pixel area may overlap more of the first layer than the first pixel area.

An area occupied by the transmission area may be 20% to 90% of the second region.

The display panel may include a first substrate on which a transistor is provided, and the first layer may be between the sensing module and the transistor.

Another embodiment provides a display device including: a display panel including a first region and a second region; and a sensing module on a rear side of the display panel. The second region overlaps the sensing module. The first region includes a first pixel area to display an image. The second region includes a second pixel area to display the image and a transmission area to transmit light output by the sensing module. Overlap percentages of first layers in the first pixel area and in the second pixel area are different with respect to a same area, the first layers to block light output by the sensing module.

The transmission area may not overlap the first layer.

The first pixel area may not overlap the first layer, and at least part of the second pixel area may overlap the first layer.

An entirety of the second pixel area may overlap the first layer.

Part of the first pixel area may overlap the first layer, and an entirety of the second pixel area may overlap the first layer.

The first layer overlapping the first pixel area may receive a predetermined voltage.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
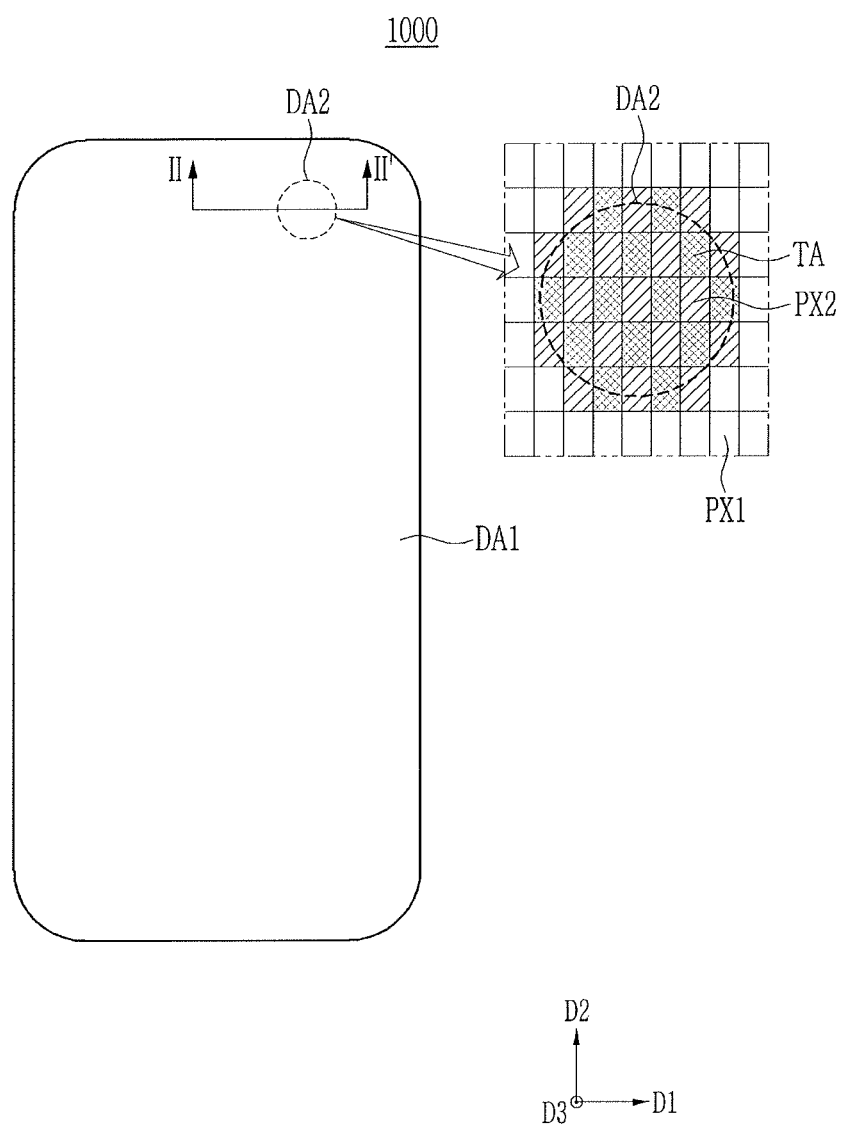
FIG. 1 illustrates a top plan view of a display device according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

The drawings and description are to be regarded as illustrative in nature and not restrictive, and like reference numerals designate like elements throughout the specification.

The size and thickness of each configuration shown in the drawings are arbitrarily shown for better understanding and ease of description. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Throughout the specification, a plan view represents a view for observing a side that is parallel to two directions (e.g., a first direction (DR1) and a second direction (DR2)) crossing each other, and a cross-sectional view represents a view for observing a side that is cut in a direction (e.g., a third direction (DR3)) that is perpendicular to a side that is parallel to the first direction (DR1) and the second direction (DR2). Further, when two constituent elements overlap each other, it means that the two constituent elements overlap each other in the third direction (DR3), for example, in the direction that is perpendicular to an upper side of a substrate.

Figure 2:
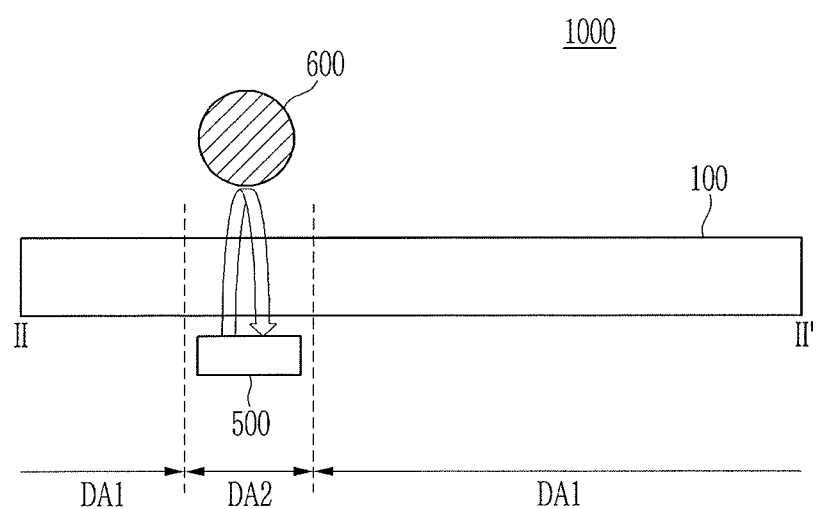
FIG. 2 illustrates a cross-sectional view with respect to a line II-II' of FIG. 1.

A display device according to an exemplary embodiment will now be described with reference to FIG. 1 and FIG. 2. FIG. 1 shows a top plan view of a display device according to an exemplary embodiment and FIG. 2 shows a cross-sectional view with respect to a line II-II' of FIG. 1.

Referring to FIG. 1, the display device 1000 according to an exemplary embodiment includes a display area. The display device 1000 may display an image to an entire front of the display device 1000. The front of the display device 1000 may not include a bezel or a non-display area or may include the non-display area provided on an edge of the display device 1000.

The display area may include a first region DA1 for displaying an image and a second region DA2 for displaying an image and having other functions. The second region DA2 may receive or transmit light with a different wavelength from the light of the displayed image much more than the first region DA1, i.e., may be more transparent to the different wavelength than the first region DA1.

The second region DA2 may be surrounded by the first region DA1 and may be ear a first side of the display device 1000 in a plan view. The second region DA2 may be provided on various positions on the display device, may have various plane forms, and may contact the first region DA1 on all, three, or two sides.

The first region DA1 includes a plurality of first pixel areas PX1. The second region DA2 may include a plurality of second pixel areas PX2 and transmission areas TA. In the present specification, the first pixel area, the second pixel area, and the transmission area may represent minimum areas distinguished by signal lines extending in the first direction D1 and the second direction D2.

The first pixel area PX1 and the second pixel area PX2 may respectively include a plurality of transistors and light-emitting devices. Actual arrangements of the first pixel area PX1 and the second pixel area PX2 according to an exemplary embodiment may be the same except for an overlapping state of a first layer to be described and a difference of an area occupied by the first layer. Arrangements of the transistor, the capacitor, and the light-emitting device included by the first pixel area PX1 and the second pixel area PX2 may be the same. Detailed arrangements of the first pixel area PX1 and the second pixel area PX2 will be described in later.

With reference to the same area, the area of the first layer overlapping the first pixel area PX1 may be different from the area of the first layer overlapping the second pixel area PX2. For example, the area of the first layer overlapping the first pixel area PX1 may be less than the area of the first layer overlapping the second pixel area PX2. In other words, an overlap percentage of first layers in first pixel area and in the second pixel area are different with respect to a same area, e.g., greater in the second pixel area PX2 than the first pixel area PX1 with respect to a same area. A detailed configuration will be described in later.

A ratio of the region for displaying an image, i.e., of the area occupied by the second pixel area PX2 in the second region DA2, may be less than a ratio of the area occupied by the first pixel area PX1 in the first region DA1. In the first region DA1, a plurality of first pixel areas PX1 may be disposed in a matrix form. In the second region DA2, a plurality of second pixel areas PX2 and transmission areas TA may be alternately disposed or they may be disposed in various ways. The second region DA2 includes a plurality of transmission areas TA, so the ratio of the second pixel area PX2 compared to the first region DA1 having the same area may be small.

The transmission area TA may not include a pixel circuit (e.g., an electrode, a transistor, or a light-emitting device). For example, the transmission area TA does not include a light-emitting device and is a non-emission region.

For example, the area of the transmission area TA may be about 20% to 90% of the area of the second region DA2. The second region DA2 includes the second pixel area PX2 and the transmission area TA, so the second region DA2 may be partly transparent. At least with respect to the different wavelength, the transmission area TA has greater light transmittance than the second pixel area PX2 and the second region DA2 has greater light transmittance than the first region DA1.

Most of light with the different wavelength, e.g., infrared light, incident to the transmission area TA may pass through the transmission area TA. An emission layer is not provided in the transmission area TA, so the image is not displayed.

Referring to FIG. 1 and FIG. 2, the display device 1000 according to an exemplary embodiment may include a sensing module 500 provided on the rear side of a display panel 100. For example, the sensing module 500 may recognize specific patterns, e.g., biometric features, such as, a fingerprint, an iris, a face, or the like.

The sensing module 500 may transmit light within a predetermined wavelength toward an object 600 provided on the display panel 100 or may receive light reflected from the object 600. The predetermined wavelength may be a wavelength other than visible light to be processed by the sensing module 500. The predetermined wavelength may mainly pass through the transmission area TA provided in the second region DA2. The predetermined wavelength output by the sensing module 500 may be infrared light, e.g., about 900 nm to 1000 nm. The sensing module 500 may correspond to all or part of the second region DA2 in a plan view.

Figure 3:
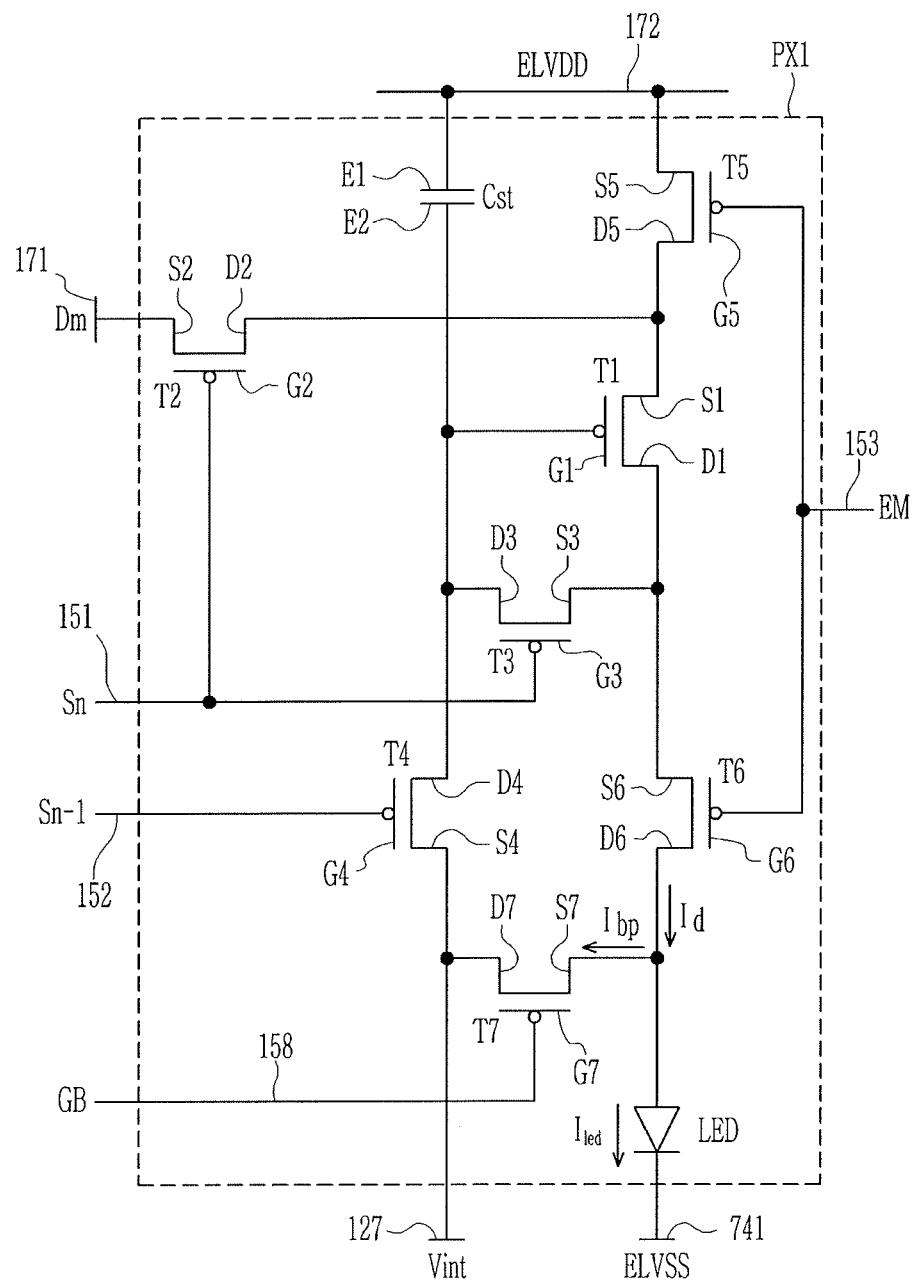
FIG. 3 illustrates a circuit diagram of a first pixel area according to an exemplary embodiment.
Figure 4:
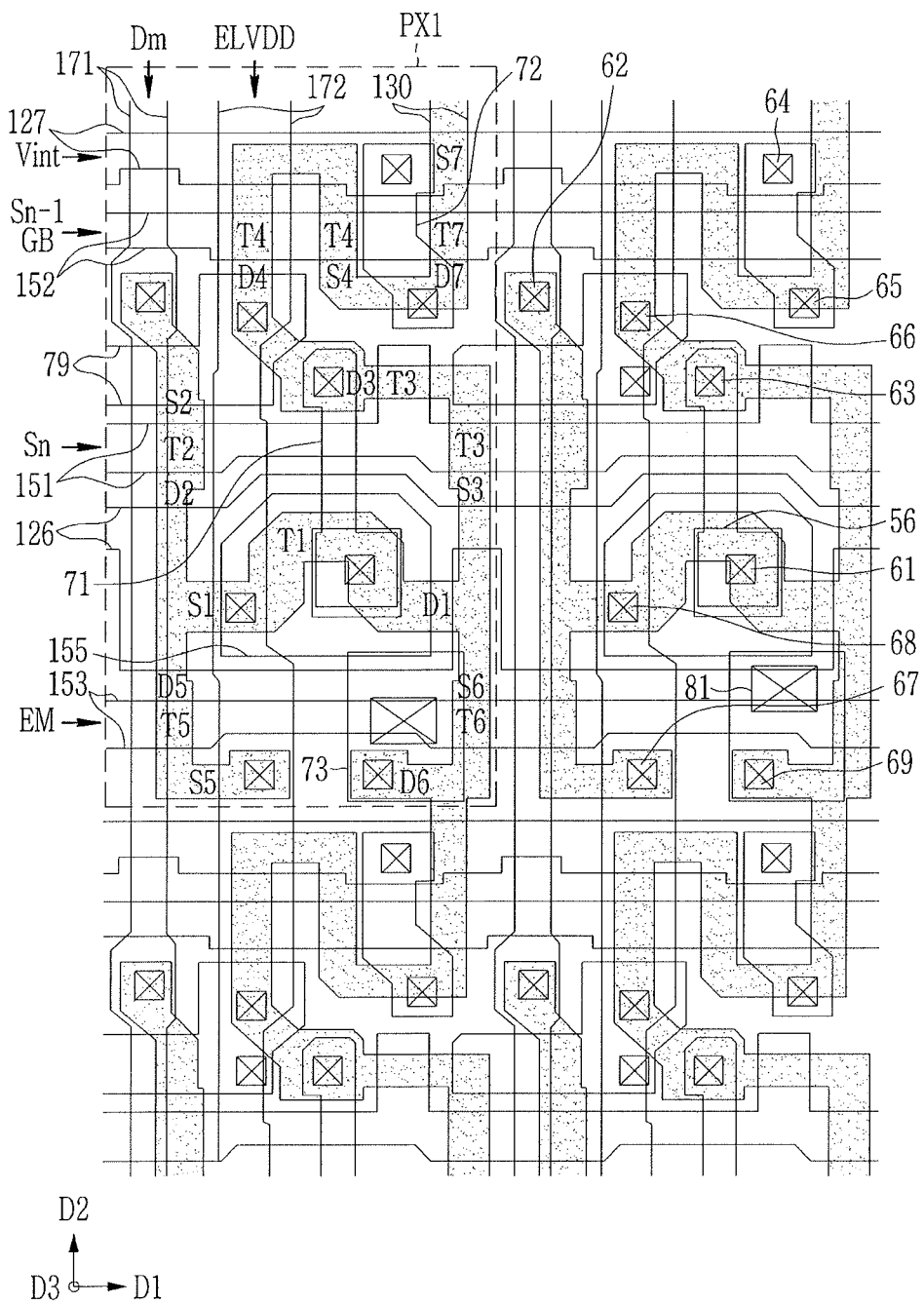
FIG. 4 illustrates a top plan view of a first pixel area according to an exemplary embodiment of FIG. 3.
Figure 5:
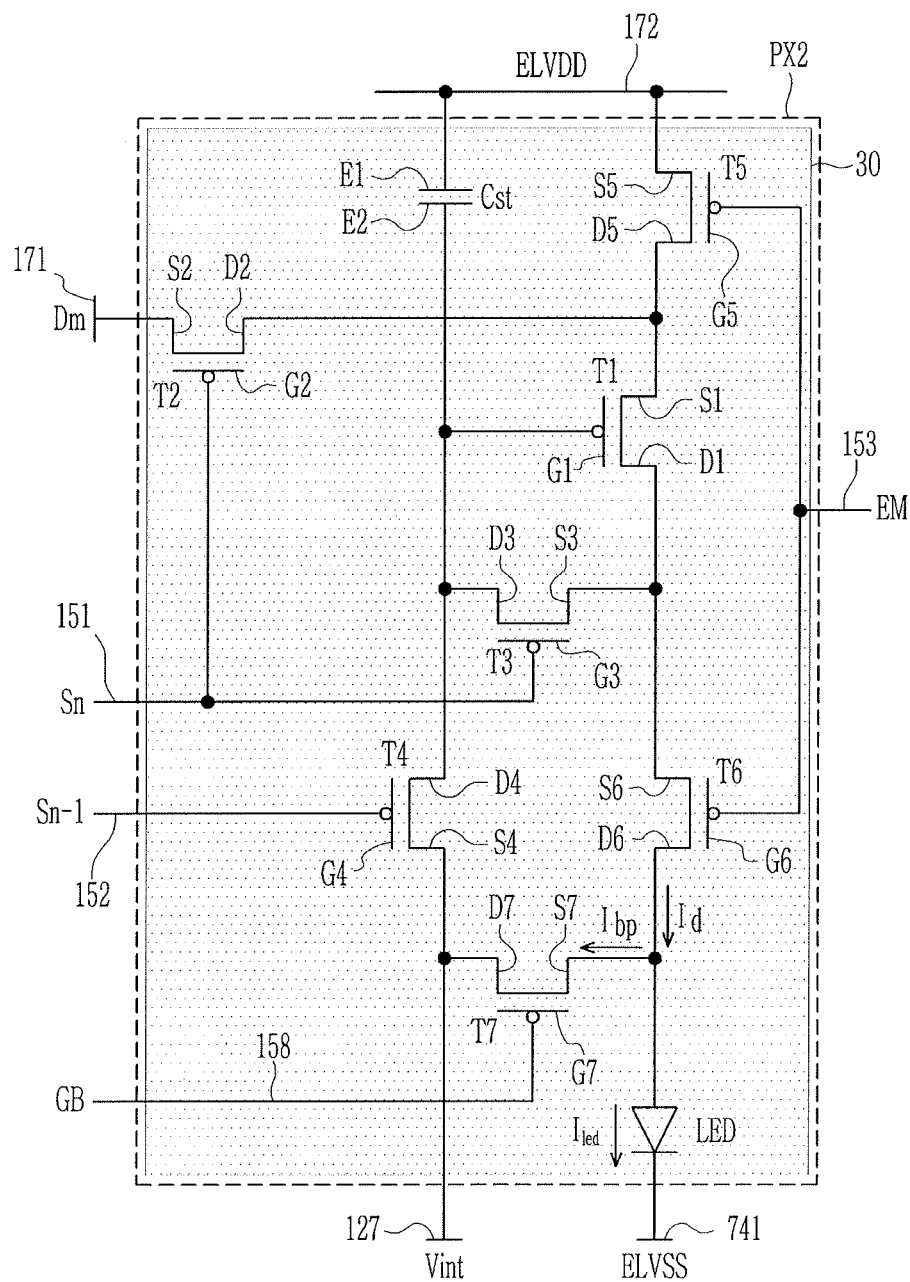
FIG. 5 illustrates a circuit diagram of a second pixel area according to an exemplary embodiment.
Figure 6:
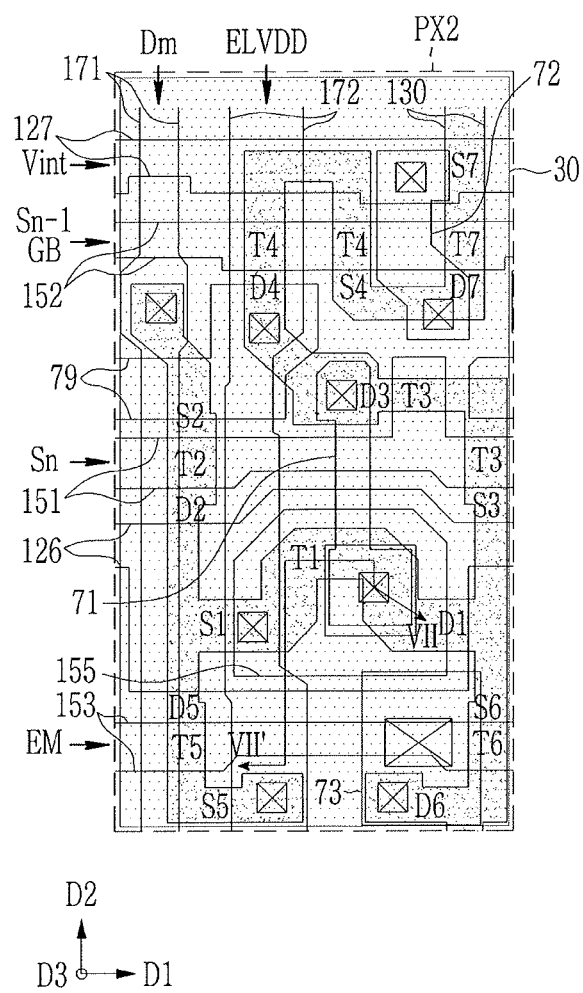
FIG. 6 illustrates a top plan view of a second pixel area according to an exemplary embodiment of FIG. 5.
Figure 7:
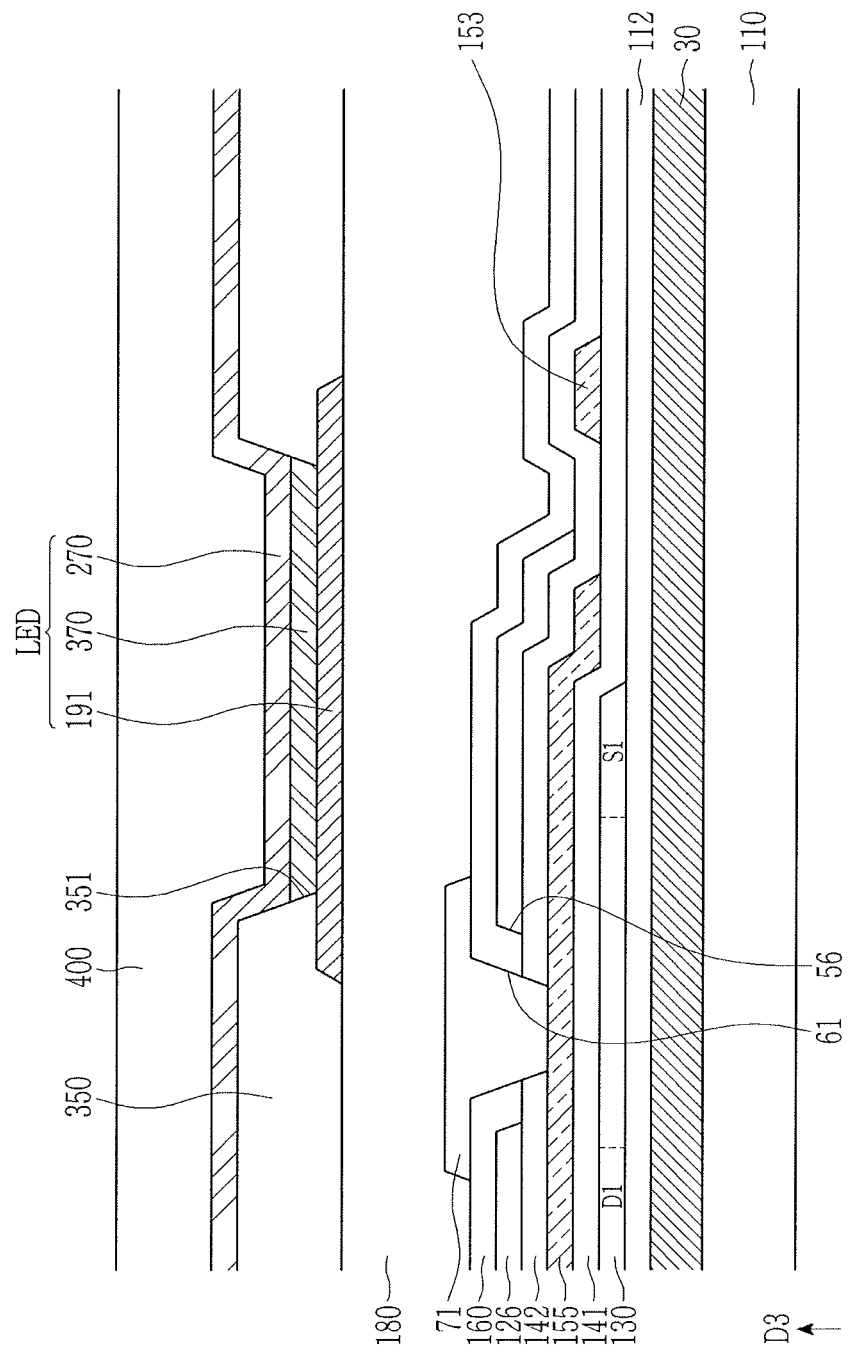
FIG. 7 illustrates a cross-sectional view with respect to a line VII-VII' of FIG. 6.
Figure 8:
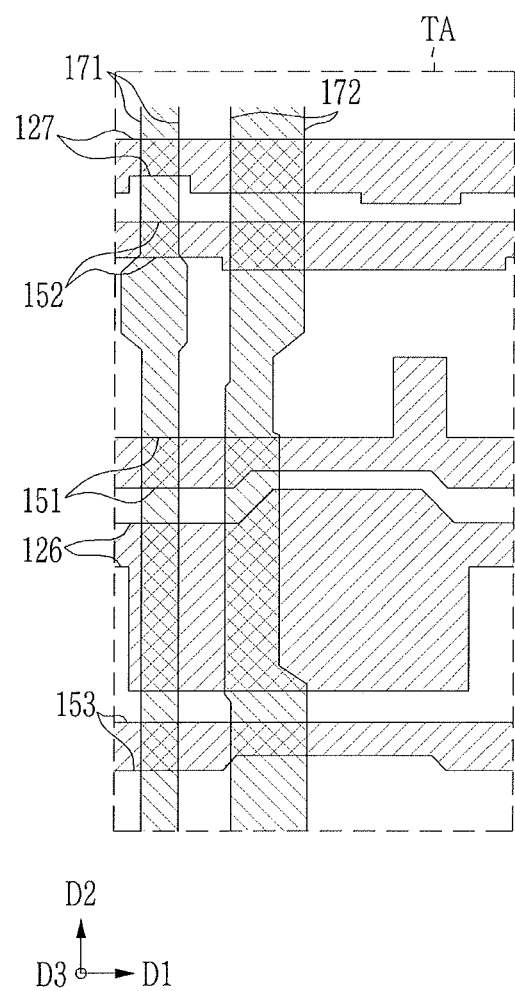
FIG. 8 illustrates a top plan view of a transmission area according to an exemplary embodiment.

A first pixel area, a second pixel area, and a transmission area according to an exemplary embodiment will now be described in detail with reference to FIG. 3 to FIG. 8. FIG. 3 shows a circuit diagram of a first pixel area according to an exemplary embodiment, FIG. 4 shows a top plan view of a first pixel area according to an exemplary embodiment, FIG. 5 shows a circuit diagram of a second pixel area according to an exemplary embodiment, FIG. 6 shows a top plan view of a second pixel area according to an exemplary embodiment, FIG. 7 shows a cross-sectional view of a second pixel area according to an exemplary embodiment, and FIG. 8 shows a top plan view of a transmission area according to an exemplary embodiment.

Referring to FIG. 3, the first pixel area PX1 according to an exemplary embodiment includes a plurality of transistors T1, T2, T3, T4, T5, T6, and T7, a storage capacitor Cst, and a light emitting diode (LED) connected to signal lines 127, 151, 152, 153, 158, 171, 172, and 741.

A plurality of transistors T1, T2, T3, T4, T5, T6, and T7 include a driving transistor T1, switching transistors connected to a first scan line 151, i.e., a second transistor T2 and a third transistor T3, and other transistors for performing operations for operating the light emitting diode (LED) (hereinafter, compensation transistors). The compensation transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include the first scan line 151, a second scan line 152, an emission control line 153, a bypass control line 158, a data line 171, a driving voltage line 172, an initialization voltage line 127, and a common voltage line 741. The bypass control line 158 may be part of the second scan line 152 or may be electrically connected thereto.

The first scan line 151 is connected to a gate driver to transmit a scan signal (Sn) to the second transistor T2 and the third transistor T3. The second scan line 152 is connected to the gate driver to transmit the second scan signal Sn−1 applied to the first pixel area PX1 provided at the front to the fourth transistor T4. The emission control line 153 is connected to an emission controller to transmit an emission control signal (EM) for controlling when the light emitting diode (LED) emits light to the fifth transistor T5 and the sixth transistor T6. The bypass control line 158 transmits a bypass signal (GB) to the seventh transistor T7.

The data line 171 transmits a data voltage (Dm) generated by the data driver, and luminance of light emitted by the light emitting diode (LED) (also referred to as a light-emitting device) changes according to the data voltage (Dm). The driving voltage line 172 applies a driving voltage (ELVDD). The initialization voltage line 127 transmits an initialization voltage (Vint) for initializing the driving transistor T1. The common voltage line 741 applies a common voltage (ELVSS). Predetermined voltages may be applied to the driving voltage line 172, the initialization voltage line 127, and the common voltage line 741.

The driving transistor T1 controls a current output according to the applied data voltage (Dm). The output driving current (Id) is applied to the light emitting diode (LED) to control brightness of the light emitting diode (LED) according to the data voltage (Dm). For this purpose, a first electrode S1 of the driving transistor T1 is to receive the driving voltage (ELVDD). The first electrode S1 is connected to the driving voltage line 172 through the fifth transistor T5. The first electrode S1 of the driving transistor T1 is connected to the second electrode D2 of the second transistor T2 to receive the data voltage (Dm). A second electrode (D1, output electrode) of the driving transistor T1 outputs a current toward the light emitting diode (LED). The second electrode D1 of the driving transistor T1 is connected to an anode of the light emitting diode (LED) through the sixth transistor T6. The gate electrode G1 is connected to one electrode (second storage electrode E2) of the storage capacitor Cst. A voltage at the gate electrode G1 changes according to the voltage stored in the storage capacitor Cst, and the driving current (Id) output by the driving transistor T1 changes.

The second transistor T2 receives the data voltage (Dm). The second transistor T2 includes a gate electrode G2 connected to the first scan line 151, a first electrode S2 connected to the data line 171, and the second electrode D2 connected to the first electrode S1 of the driving transistor T1. When the second transistor T2 is turned on according to the scan signal (Sn) transmitted through the first scan line 151, the data voltage (Dm) transmitted through the data line 171 is transmitted to the first electrode S1 of the driving transistor T1.

The third transistor T3 transmits the compensation voltage (voltage of Dm+Vth) generated when the data voltage (Dm) passes through the driving transistor T1 to a second storage electrode E2 of the storage capacitor Cst. The third transistor T3 includes a gate electrode G3 connected to the first scan line 151, a first electrode S3 connected to the second electrode D1 of the driving transistor T1, and a second electrode D3 connected to the second storage electrode E2 of the storage capacitor Cst and the gate electrode G1 of the driving transistor T1. The third transistor T3 is turned on according to the scan signal (Sn) transmitted through the first scan line 151 to connect the gate electrode G1 of the driving transistor T1 and the second electrode D1, and to connect the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. The fourth transistor T4 includes a gate electrode G4 connected to the second scan line 152, a first electrode S4 connected to the initialization voltage line 127, and a second electrode D4 that passes through the second electrode D3 of the third transistor T3 and is connected to the second storage electrode E2 of the storage capacitor Cst and the gate electrode G1 of the driving transistor T1. The fourth transistor T4 transmits the initialization voltage (Vint) to the gate electrode G1 of the driving transistor T1 and the second storage electrode E2 of the storage capacitor Cst according to the second scan signal Sn−1 received through the second scan line 152. Accordingly, the gate voltage at the gate electrode G1 of the driving transistor T1 and the storage capacitor Cst are initialized. The initialization voltage (Vint) has a low voltage value to turn on the driving transistor T1.

The fifth transistor T5 transmits the driving voltage (ELVDD) to the driving transistor T1. The fifth transistor T5 includes a gate electrode G5 connected to the emission control line 153, a first electrode S5 connected to the driving voltage line 172, and a second electrode D5 connected to the first electrode S1 of the driving transistor T1.

The sixth transistor T6 transmits the driving current (Id) output by the driving transistor T1 to the light emitting diode (LED). The sixth transistor T6 includes a gate electrode G6 connected to the emission control line 153, a first electrode S6 connected to the second electrode D1 of the driving transistor T1, and a second electrode D6 connected to the anode of the light emitting diode (LED).

The fifth transistor T5 and the sixth transistor T6 are turned on by the emission control signal (EM) received through the emission control line 153. When the driving voltage (ELVDD) is applied to the first electrode S1 of the driving transistor T1 through the fifth transistor T5, the driving transistor T1 outputs the driving current (Id) according to the voltage at the gate electrode G1 of the driving transistor T1 (i.e., voltage at the second storage electrode E2 of the storage capacitor Cst). The output driving current (Id) is transmitted to the light emitting diode (LED) through the sixth transistor T6. As the current ($I_{led}$) flows to the light emitting diode (LED), the light emitting diode (LED) emits light.

The seventh transistor T7 initializes the anode of the light emitting diode (LED). The seventh transistor T7 a gate electrode G7 connected to the bypass control line 158, a first electrode S7 connected to the anode of the light emitting diode (LED), and a second electrode D7 connected to the initialization voltage line 127. The bypass control line 158 may be connected to the second scan line 152, and a signal with a same timing as that of the second scan signal Sn−1 is applied to the bypass signal (GB). The bypass control line 158 may not be connected to the second scan line 152 and may transmit a signal that is different from the second scan signal Sn−1. When the seventh transistor T7 is turned on by the bypass signal (GB), the initialization voltage (Vint) is applied to the anode of the light emitting diode (LED) to be initialized.

The storage capacitor Cst includes a first storage electrode E1 of the storage capacitor Cst connected to the driving voltage line 172 and a second storage electrode E2 connected to the gate electrode G1 of the driving transistor T1, the second electrode D3 of the third transistor T3, and the second electrode D4 of the fourth transistor T4. As a result, the second storage electrode E2 determines the voltage at the gate electrode G1 of the driving transistor T1, and receives the data voltage (Dm) through the second electrode D3 of the third transistor T3 or the initialization voltage (Vint) through the second electrode D4 of the fourth transistor T4.

The anode of the light emitting diode (LED) is connected to the second electrode D6 of the sixth transistor T6 and the first electrode S7 of the seventh transistor T7. The cathode of the light emitting diode (LED is connected to the common voltage line 741 for transmitting the common voltage (ELVSS).

In an exemplary embodiment described with reference to FIG. 3, the circuit of the first pixel area PX1 includes seven transistors T1 to T7 and one capacitor Cst. A number of transistors and capacitors and their connection are changeable in various ways.

A detailed planar structure of a first pixel area PX1 will now be described with reference to FIG. 4. Referring to FIG. 4, the first pixel area PX1 includes a first scan line 151 extending in the first direction D1 and transmitting a first scan signal (Sn), a second scan line 152 for transmitting a second scan signal Sn−1, an emission control line 153 for transmitting an emission control signal (EM), and an initialization voltage line 127 for transmitting an initialization voltage (Vint). The bypass signal (GB) is transmitted through the second scan line 152.

The emissive display device includes the data line 171 extending in a second direction D2 crossing the first direction D1 and transmitting a data voltage (Dm), and a driving voltage line 172 for transmitting a driving voltage (ELVDD).

The emissive display device includes a driving transistor T1, a second transistor T2, a third transistor T3, a fourth transistor T4, a fifth transistor T5, a sixth transistor T6, a seventh transistor T7, a storage capacitor Cst, and a light emitting diode (LED).

Respective channels of the driving transistor T1, the second transistor T2, the third transistor T3, the fourth transistor T4, the fifth transistor T5, the sixth transistor T6, and the seventh transistor T7 are provided on the semiconductor layer 130 extending along the first and second directions D1 and D2. Further, at least some of the first electrodes and the second electrodes of a plurality of transistors T1, T2, T3, T4, T5, T6, and T7 are on the semiconductor layer 130. The semiconductor layer (130; shown as a shaded portion in FIG. 4) may be formed to be bent in various ways. The semiconductor layer 130 may include a polycrystalline semiconductor such as polysilicon, or an oxide semiconductor.

The semiconductor layer 130 includes a channel doped with an n-type impurity or a p-type impurity, and a first doping region and a second doping region provided on respective sides of the channel and having a greater doping concentration than the channel. The first doping region and the second doping region respectively correspond to the first electrode and the second electrode of a plurality of transistors T1, T2, T3, T4, T5, T6, and T7. When one of the first doping region and the second doping region is a source region, the other may be a drain region. Also, a region between the first electrode and the second electrode of different transistors may be doped on the semiconductor layer 130 so that the two transistors may be electrically connected to each other.

The respective channels of a plurality of transistors T1, T2, T3, T4, T5, T6, and T7 overlap the gate electrodes of the transistors T1, T2, T3, T4, T5, T6, and T7, and are provided between the first electrodes and the second electrodes of the transistors T1, T2, T3, T4, T5, T6, and T7. A plurality of transistors T1, T2, T3, T4, T5, T6, and T7 may have substantially the same stacked structure. The driving transistor T1 will be described in detail, and the other transistors T2, T3, T4, T5, T6, and T7 will be briefly described.

The driving transistor T1 includes a channel, a first gate electrode 155 (G1 in FIG. 3), the first electrode S1, and the second electrode D1. A channel of the driving transistor T1 is between the first electrode S1 and the second electrode D1, and overlaps the first gate electrode 155 in a plan view. The channel is bent so that the channel may be formed to be long in a limited region along a primary direction in which the channel extends, e.g., the first direction D1. As the channel becomes longer, a driving range of the gate voltage (Vg) applied to the first gate electrode 155 of the driving transistor T1 increases, and the driving current (Id) constantly increases according to the gate voltage (Vg). As a result, a gray scale of light output by the light emitting diode (LED) may be precisely controlled by changing the size of the gate voltage (Vg), and display quality of the emissive display device may be improved. Further, the channel does not extend in one direction but extends in various directions, so an influence caused by directivity is offset in the manufacturing process, and a process distribution influence is reduced as a merit. Therefore, deterioration of image quality, such as defects of stains (e.g., a luminance difference that is generated according to a pixel when the same data voltage (Dm) is applied), that may be generated when a characteristic of the driving transistor T1 becomes different according to a region of the display device according to the process distribution. The above-noted channel form may have various shapes in addition to the illustrated shape of Ω.

The first gate electrode 155 overlaps the channel in a plan view. The first electrode S1 and the second electrode D1 are on respective sides of the channel. An extended portion of the storage line 126 is insulated and provided on the first gate electrode 155. The extended portion of the storage line 126 overlaps the gate electrode 155 with a second gate insulating layer therebetween in a plan view to form a storage capacitor Cst. The extended portion of the storage line 126 is the first storage electrode (E1 of FIG. 3) of the storage capacitor Cst, and the first gate electrode 155 forms a second storage electrode (E2 of FIG. 3). An opening 56 is in the extended portion of the storage line 126 so that the first gate electrode 155 may be connected to a first data connecting member 71. In the opening 56, a top side of the first gate electrode 155 is electrically connected to the first data connecting member 71 through a contact hole 61. The first data connecting member 71 is connected to the second electrode D3 of the third transistor T3 to connect the gate electrode 155 of the driving transistor T1 and the second electrode D3 of the third transistor T3.

The gate electrode of the second transistor T2 may be part of the first scan line 151. The first electrode S2 of the second transistor T2 is connected to the data line 171 through a contact hole 62. The first electrode S2 and the second electrode D2 may be provided on the semiconductor layer 130.

The third transistor T3 may be a dual gate third transistor. Portions of the third transistor T3 extend along the first direction D1 and the second direction D2, e.g., are orthogonal to each other. The gate electrodes of the third transistor T3 includes a portion of the first scan line 151 the protrudes along the second direction DR2 and the first scan line 151. The above-noted structure may be referred to as a dual gate structure and may intercept a flow of the leakage current. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact hole 63.

The fourth transistor T4 may be a dual gate fourth transistor T4 where the second scan line 152 contacts the semiconductor layer 130. The gate electrodes of the fourth transistor T4 may be part of the second scan line 152. The second electrode D4 of the fourth transistor T4 is connected to the second electrode D3 of the third transistor T3. The above-noted structure will be referred to as a dual gate structure and intercepts a flow of a leakage current. A second data connecting member 72 is connected to the first electrode S4 of the fourth transistor T4 through a contact hole 65 and the first data connecting member 71 is connected to the second electrode D4 of the fourth transistor T4 through the contact hole 63.

As described above, the dual gate structure of the third transistor T3 and the fourth transistor T4 is used, so an electron moving path of the channel is blocked in the off state to efficiently prevent the leakage current from being generated.

The gate electrode of the fifth transistor T5 may be part of the emission control line 153. The first electrode S5 of the fifth transistor T5 is connected to the driving voltage line 172 through a contact hole 67. The second electrode D5 is connected to the first electrode S1 of the driving transistor T1 through the semiconductor layer 130.

The gate electrode of the sixth transistor T6 may be part of the emission control line 153. The second electrode D6 of the sixth transistor T6 is connected to a third data connecting member 73 through a contact hole 69. The first electrode S6 is connected to the second electrode D1 of the driving transistor through the semiconductor layer 130.

The gate electrode of the seventh transistor T7 may be part of the second scan line 152. The first electrode S7 of the seventh transistor T7 is connected to the second electrode D6 of the sixth transistor T6. The second electrode D7 is connected to the first electrode S4 of the fourth transistor T4.

The storage capacitor Cst includes the first storage electrode E1 and the second storage electrode E2 overlapping each other with a second gate insulating layer 142 therebetween (see FIG. 7). The second storage electrode E2 corresponds to the gate electrode 155 of the driving transistor T1 and the first storage electrode E1 may be an extended portion of the storage line 126. Here, the second gate insulating layer 142 is a dielectric material, and capacitance is determined by charges stored in the storage capacitor Cst and a voltage between the first and second storage electrodes E1 and E2. The first gate electrode 155 is used as the second storage electrode E2, so a space for forming a storage capacitor Cst may be acquired in a space narrowed by the channel of the driving transistor T1 occupying a large area in the pixel.

The driving voltage line 172 is connected to the first storage electrode E1 through a contact hole 68. Therefore, the storage capacitor Cst stores the charges corresponding to the difference between the driving voltage (ELVDD) transmitted to the first storage electrode E1 through the driving voltage line 172 and the gate voltage (Vg) of the gate electrode 155.

The second data connecting member 72 is connected to the initialization voltage line 127 through a contact hole 64. A pixel electrode is connected to the third data connecting member 73 through a contact hole 69.

A parasitic capacitor control pattern 79 may be provided between the dual gate electrodes of the third transistor T3. A parasitic capacitor is provided in the pixel, and image quality characteristics may be changed when the voltage applied to the parasitic capacitor changes. The driving voltage line 172 is connected to the parasitic capacitor control pattern 79 through a contact hole 66. By this, the changing of the image quality characteristic caused by applying a driving voltage (ELVDD) that is a constant DC voltage to the parasitic capacitor may be prevented. The parasitic capacitor control pattern 79 may be provided in a region that is different from what is shown in the drawing, and a voltage other than the driving voltage (ELVDD) may be applied.

A first end of the first data connecting member 71 is connected to the gate electrode 155 through the contact hole 61, and a second end thereof is connected to the second electrode D3 of the third transistor T3 and the second electrode D4 of the fourth transistor T4 through the contact hole 63.

A first end of the second data connecting member 72 is connected to the first electrode S4 of the fourth transistor T4 through the contact hole 65, and a second end thereof is connected to the initialization voltage line 127 through the contact hole 64.

The third data connecting member 73 is connected to the second electrode of the sixth transistor T6 through the contact hole 69.

A second region according to an exemplary embodiment will now be described with reference to FIG. 5 to FIG. 8. FIG. 5 to FIG. 7 show a second pixel area of a second region and FIG. 8 shows a transmission area of a second region.

The second pixel area PX2 according to an exemplary embodiment may have a same pixel arrangement as the first pixel area PX1 but includes a first layer 30. The description on the first pixel area PX1 provided with reference to FIG. 3 and FIG. 4 may be applied to the second pixel area PX2, so it will be omitted.

FIG. 5 shows a circuit diagram on the second pixel area PX2 having the first layer 30 overlapping the second pixel area PX2. Referring to FIG. 5 and FIG. 6, the first layer 30 may be provided at the front of the second pixel area PX2, e.g., between the sensing module 500 and transistors of the second pixel area PX2. The second pixel area PX2 includes seven transistors T1 to T7 and one capacitor Cst as in the first pixel area PX1. The first layer 30 according to an exemplary embodiment may completely overlap the second pixel area PX2, e.g., may overlap the seven transistors T1 to T7 and one capacitor Cst.

The first layer 30 is conductive and blocks light output from the sensing module 500, e.g., infrared light. The first layer 30 may not receive an additional voltage, may have a predetermined voltage applied thereto, or may be grounded. Applying the predetermined voltage may protect the change of potential generated when specific charges are injected into the first layer 30.

A stacked structure of a second pixel area PX2 will now be described with reference to FIG. 5, FIG. 6, and FIG. 7.

The display panel 100 includes a first substrate 110. The first substrate 110 may include a plastic layer and a barrier layer. The plastic layer and the barrier layer may be alternately stacked.

The plastic layer may include one of polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), poly(arylene ether sulfone), and a combination thereof. The barrier layer may include at least one of a silicon oxide, a silicon nitride, and an aluminum oxide, and without being limited to this, it may include any kinds of inorganic materials.

The first layer 30 may be provided on the first substrate 110. The entire second pixel area PX2 may overlap the first layer 30. The first layer 30 has conductivity, and it may include various conductive metals or semiconductor materials with a conductive characteristic corresponding to the same. The first layer 30 may also block or absorb light output from the sensing module 500, e.g., infrared light.

A transmission area TA may be provided on all sides of the second pixel area PX2, e.g., top, bottom, right, and left sides, as shown in FIG. 1. The first layer 30 may overlap the respective second pixel areas PX2. For example, a single portion of the first layer 30 may correspond to a single second pixel area PX2, e.g., another second pixel area PX2 and corresponding first layer 30 may be separated from each other. When a plurality of second pixel areas PX2 are adjacent, e.g., share a border, the adjacent second pixel area PX2 and the adjacent overlapping first layer 30 may be connected.

A buffer layer 112 is on the first layer 30. The buffer layer 112 may include an inorganic insulating material, e.g., a silicon oxide, a silicon nitride, an aluminum oxide, or the like, or may include an organic insulating material, e.g., a polyimide, an acryl, or the like.

Channels of the plurality of transistors T1, T2, T3, T4, T5, T6, and T7, and the semiconductor layer 130 including the first electrode and the second electrode are provided on the buffer layer 112.

A first gate insulating layer 141 may cover the semiconductor layer 130. A first gate conductor including the first gate electrode 155, the scan line 151, the second scan line 152, and the emission control line 153 is on the first gate insulating layer 141.

A second gate insulating layer 142 may covers the first gate conductor. The first gate insulating layer 141 and the second gate insulating layer 142 may include an inorganic insulating material, e.g., a silicon nitride, a silicon oxide, an aluminum oxide, or the like, or an organic insulating material.

A second gate conductor including the storage line 126, the initialization voltage line 127, and the parasitic capacitor control pattern 79 is provided the second gate insulating layer 142.

An interlayer insulating layer 160 may cover the second gate conductor. The interlayer insulating layer 160 may include an inorganic insulating material, e.g., a silicon nitride, a silicon oxide, an aluminum oxide, and the like, or an organic insulating material.

A data conductor including the data line 171, the driving voltage line 172, the first data connecting member 71, the second data connecting member 72, and the third data connecting member 73 is on the interlayer insulating layer 160. The first data connecting member 71 may be connected to the first gate electrode 155 through the contact hole 61.

A passivation layer 180 may cover the data conductor. The passivation layer 180 may be a planarization layer and may include an organic insulating material or an inorganic insulating material.

A first electrode 191 is on the passivation layer 180. The first electrode 191 is connected to the third data connecting member 73 through the contact hole 81 formed in the passivation layer 180 (see FIG. 4).

A pixel defining layer or partition wall 350 is provided on the passivation layer 180 and the first electrode 191. The partition wall 350 includes an opening 351 overlapping the first electrode 191, e.g., exposing most of the first electrode 191. An emission layer 370 is provided in the opening 351. A second electrode 270 is provided on the emission layer 370 and the partition wall 350, e.g., along sidewalls of the opening 351 and an upper surface of the partition wall 350. The first electrode 191, the emission layer 370, and the second electrode 270 form a light-emitting device (LED). The first electrode 191 may be a pixel electrode and the second electrode 270 may be a common electrode.

The pixel electrode may be an anode that is a hole injecting electrode and the common electrode may be a cathode that is an electron injecting electrode. Alternatively, the pixel electrode may be a cathode, and the common electrode may be an anode. When holes and electrons are injected into the emission layer from the pixel electrode and the common electrode, and excitons generated by a combination of the injected holes and electrons transit to a ground state from an excited state to emit light.

An encapsulation layer 400 for protecting the light-emitting device (LED) may be on the second electrode 270. The encapsulation layer 400 may contact the second electrode 270 as shown or may be separated from the second electrode 270.

The encapsulation layer 400 may be a thin film encapsulation layer on which an inorganic film and an organic film are stacked, e.g. a triple-layer having an inorganic film, an organic film, and an inorganic film. According to exemplary embodiments, a capping layer and a functional layer may be between the second electrode 270 and the encapsulation layer 400.

The second pixel area PX2 may overlap an optical member, particularly a sensing module 500 as described above. Characteristics of the transistors T1 to T7 included by the second pixel area PX2 may be changed by infrared light output by the sensing module. According to an exemplary embodiment, the entire second pixel area PX2 may overlap the first layer 30. The first layer 30 intercepts and blocks the light output by the sensing module to prevent the characteristics of transistors in the second pixel area PX2 from being changed by the light output from the sensing module 500, e.g., infrared light.

Referring to FIG. 8, the transmission area TA may not include a transistor and a light-emitting device. The transmission area TA may include wires for connecting adjacent second pixel areas PX2 in the second region. For example, as shown in FIG. 8, the transmission area TA may include wires, e.g., the first scan line 151, the second scan line 152, the emission control line 153, the storage line 126, the initialization voltage line 127, the data line 171, and/or the driving voltage line 172. The transmission area TA may be manufactured in the same process as the first pixel area PX1 and the second pixel area PX2, and may not include some of the elements in the second pixel area PX2 (e.g., a semiconductor layer).

Since the transmission area TA does not include an additional semiconductor layer, it does not include a transistor. Further, the transmission area TA does not include an additional light-emitting device, so cannot display an image. Depending on exemplary embodiments, the transmission area TA may overlap the common electrode or the common electrode may be removed from the transmission area TA.

According to the above-described exemplary embodiment, the first pixel area PX1 in the first region DA1 and the second pixel area PX2 in the second region DA2 may substantially include a transistor, a capacitor, and a light-emitting device arranged in a like manner. The second pixel area PX2 may further include a first layer 30 overlapping the plurality of transistors and the capacitor. An area of the first layer 30 overlapping the second pixel area PX2 may be different from an area of the first layer 30 overlapping the first pixel area PX1. For example, the first pixel area PX1 may not overlap the first layer 30 such that generation of an unnecessary load or generation of coupling may be prevented.

The light output from the sensing module 500, e.g., infrared light, from the rear side of the display panel may be incident on the second pixel area PX2, such that the characteristics of the transistor included by the second pixel area PX2 may be influenced. However, when the second pixel area PX2 includes the first layer 30 to block light output from the sensing module 500, e.g., infrared light, changes in physical properties of the transistor due to the light output from the sensing module 500, e.g., infrared light, may be reduced or prevented.

Further, the second region DA2 includes the transmission area TA2 in addition to the second pixel area PX2, so transmittance of light to and from the optical member, e.g., the sensing module 500, may be high. Accordingly, a recognition rate and sensing accuracy on the object to be recognized by the optical member may increase.

A first pixel area provided in a first region according to an exemplary embodiment will now be described with reference to FIG. 9 to FIG. 12. The second pixel area according to an exemplary embodiment corresponds to the description provided with reference to FIG. 5 and FIG. 7, and the transmission area corresponds to the description provided with reference to FIG. 8, which will be omitted.

Figure 9:
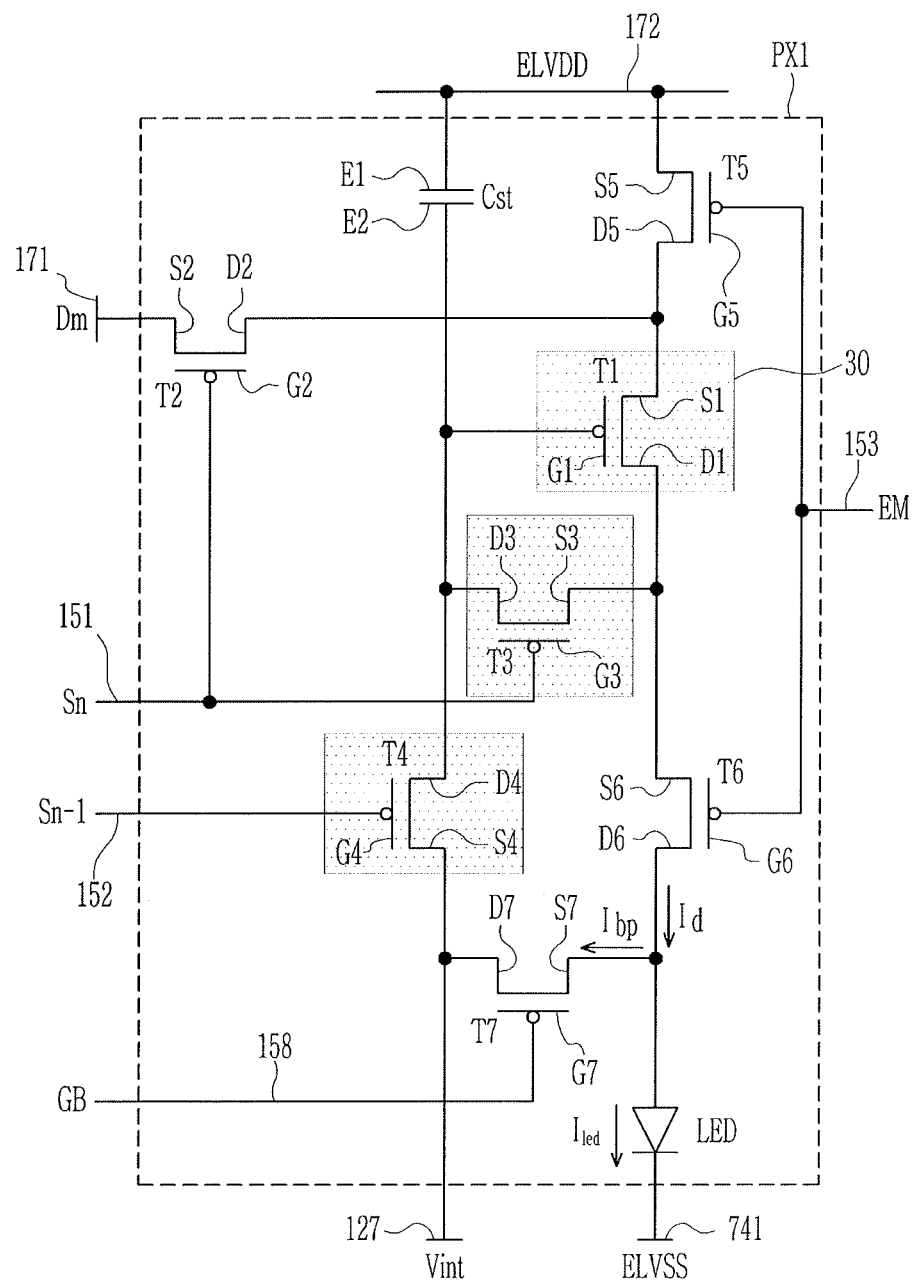
FIG. 9 illustrates a circuit diagram of a first pixel area according to an exemplary embodiment.
Figure 10:
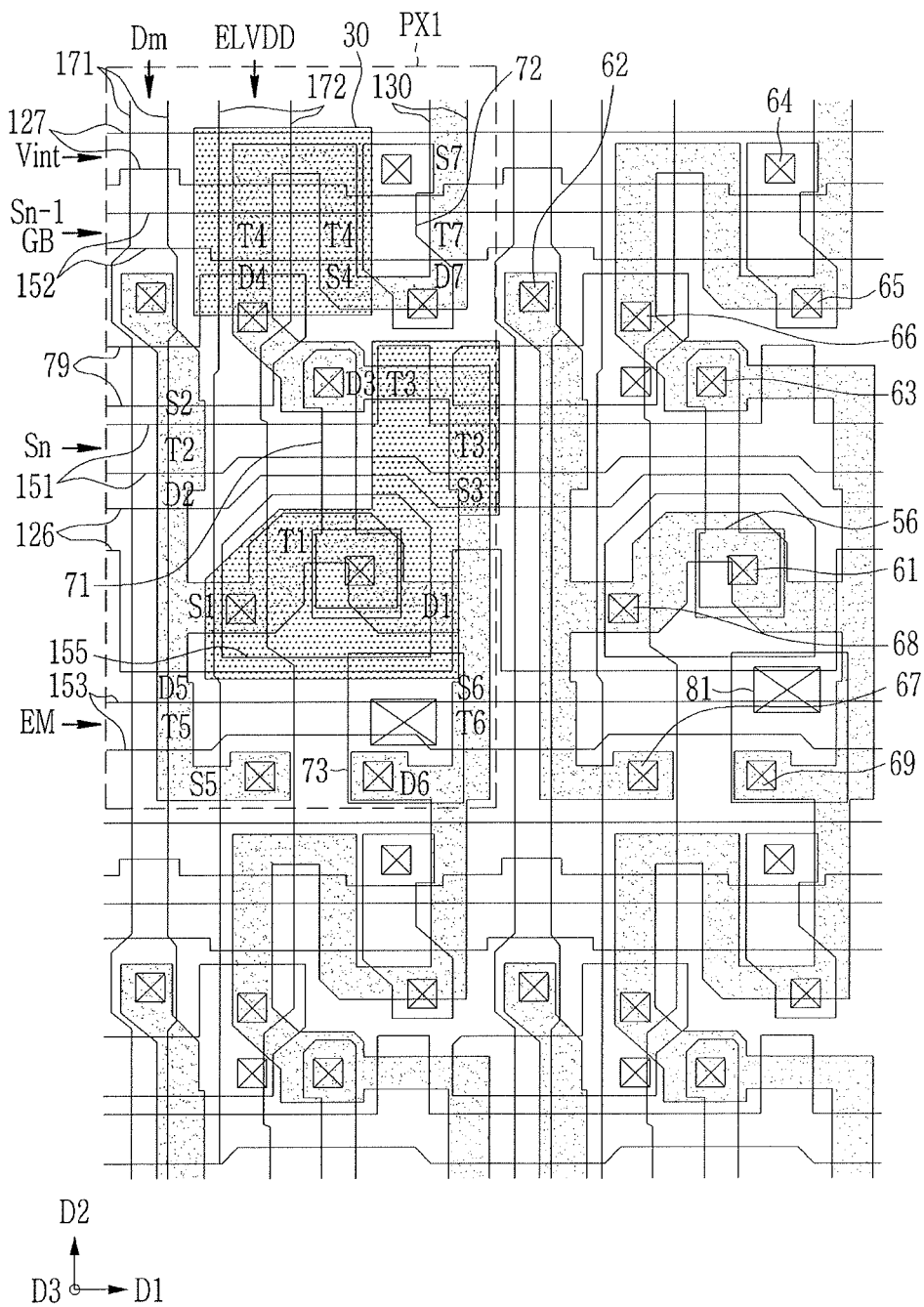
FIG. 10 illustrates a top plan view of a first pixel area of FIG. 9.
Figure 11:
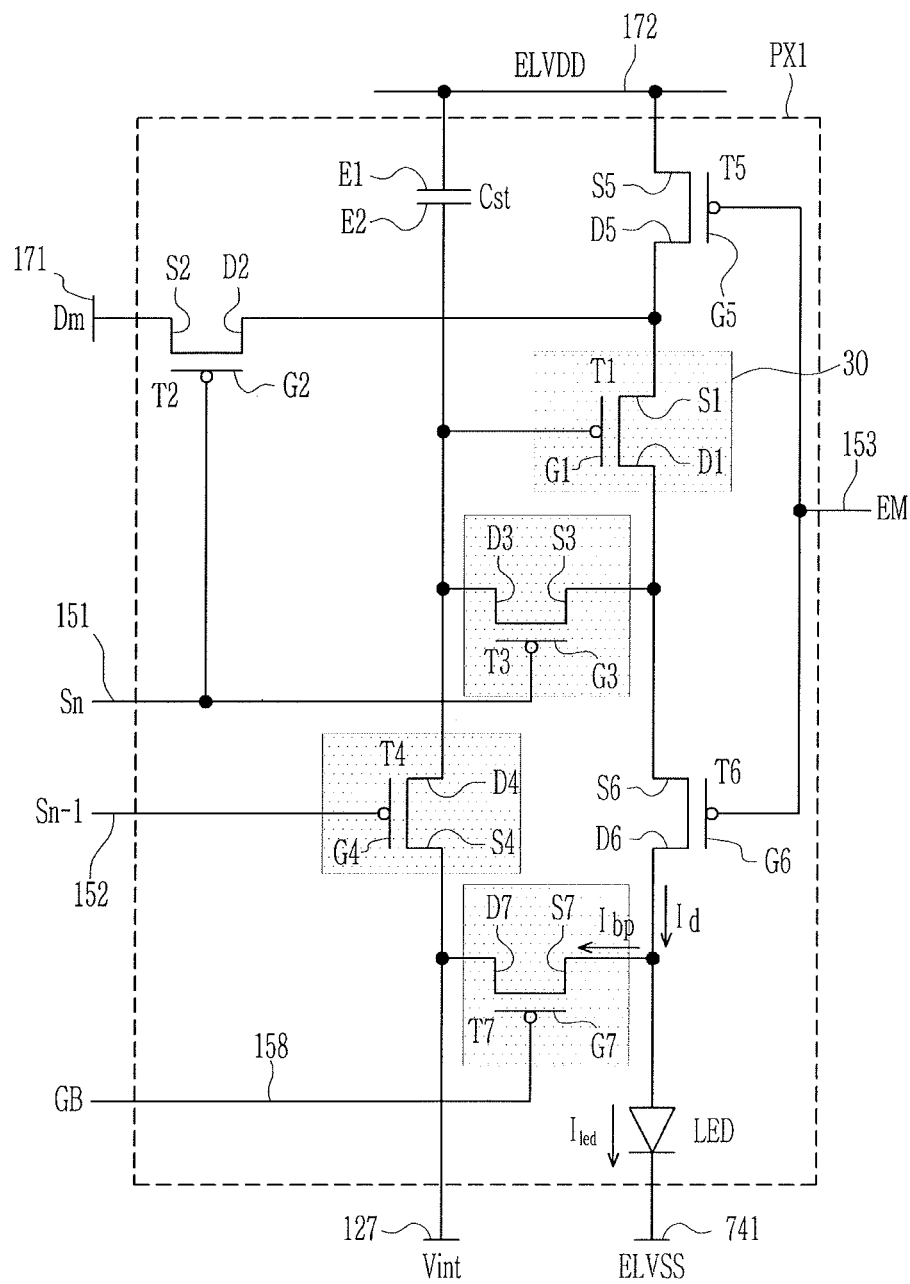
FIG. 11 illustrates a circuit diagram of a first pixel area according to an exemplary embodiment.
Figure 12:
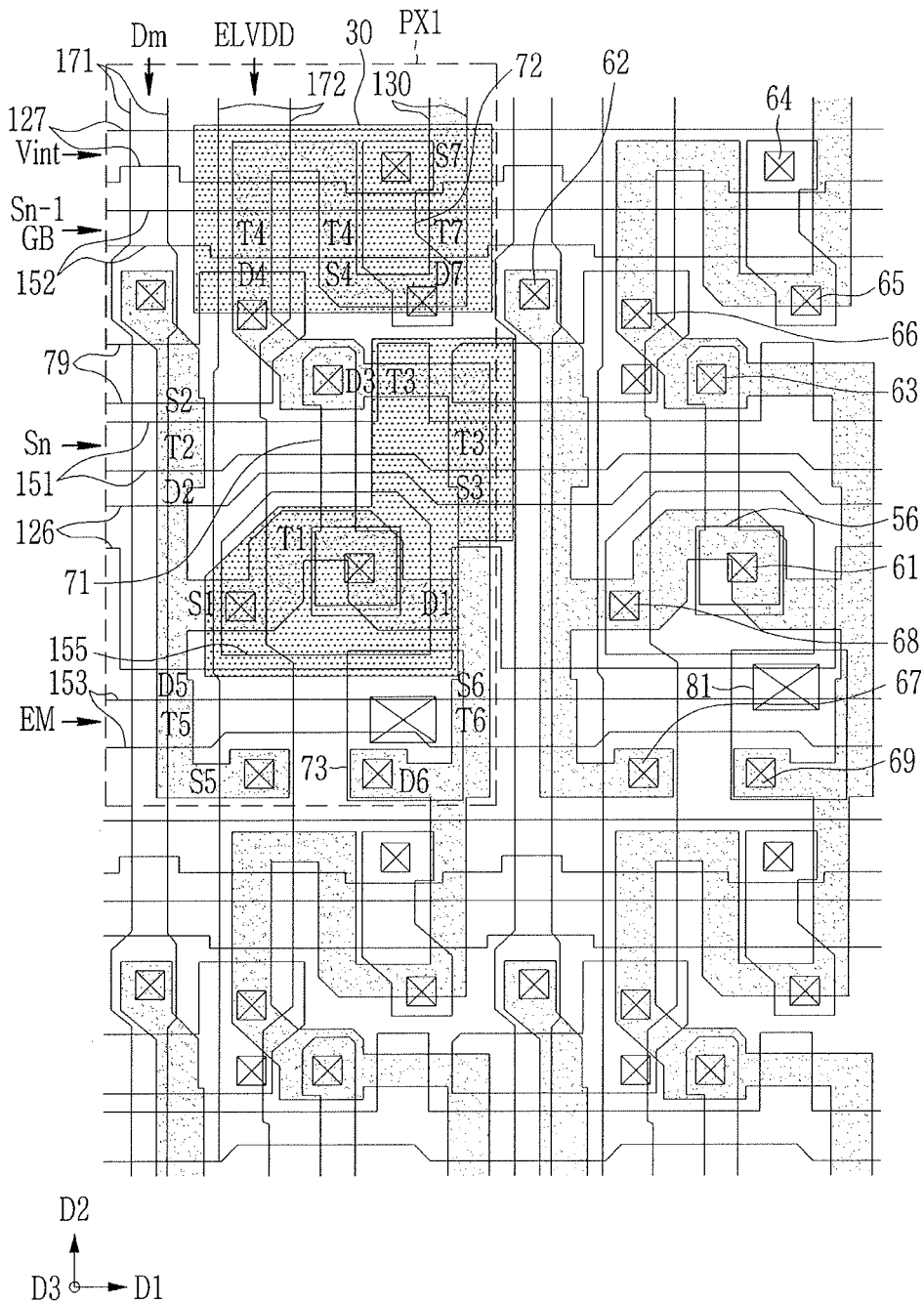
FIG. 12 illustrates a top plan view of a first pixel area of FIG. 11.

FIG. 9 shows a circuit diagram of a first pixel area according to an exemplary embodiment, and FIG. 10 shows a top plan view of a first pixel area of FIG. 9. FIG. 11 shows a circuit diagram of a first pixel area according to an exemplary embodiment, and FIG. 12 shows a top plan view of a first pixel area of FIG. 11.

Referring to FIG. 9 and FIG. 10, the first pixel area PX1 may include a plurality of transistors T1 to T7 and a capacitor Cst. A portion of the first pixel area PX1 may overlap the first layer 30. The first layer 30 has conductivity and may include various conductive metals or a semiconductor material with a conductive characteristic corresponding to the same.

The first layer 30 may be a layer for blocking light output from the sensing module 500, e.g., infrared light. Both infrared light and visible light may be incident on the first layer 30. The first layer 30 may be transmit visible light and block infrared light.

The first layer 30 may overlap the driving transistor T1, the third transistor T3, and the compensation transistor T4. The first layer 30 may overlap the driving transistor T1 that is substantially influenced by a leakage current in the first pixel area PX1, the third transistor T3, and the fourth transistor T4. The first layer 30 is provided in a partial region, so the variation of the characteristic of the transistor caused by transmission of the infrared light may be prevented without substantially reducing transmittance of visible light.

According to an exemplary embodiment, the first layer 30 overlapping the first pixel area PX1 may be connected to the scan line 151, the data line 171, the emission control line 153, and/or the driving voltage line 172.

When the sensing module 500 is provided on the rear side of the display panel according to an exemplary embodiment, beams output by the sensing module may be partly input to the first region DA1 as well as to the second region DA2. The characteristic of the transistor may be changed or a leakage current may be generated by the infrared light. When the first pixel area PX1 includes the first layer 30 partly overlapping the transistors, leakage current may be reduced, degradation of image quality caused by the leakage current may be prevented, and changes of physical properties of the transistors may be minimized.

To sum up, the first pixel area PX1 may overlap the first layer 30. Particularly, the first layer 30 may overlap some of the transistors most likely to have changed physical properties due to infrared light from among a plurality of transistors in by the first pixel area PX1.

In this instance, the second pixel area PX2 may include the first layer 30 overlapping the plurality of transistors and the capacitor. Regarding the second pixel area PX2, the infrared light may be output from the rear side of the display panel and characteristics of the transistors may be influenced by the infrared light. However, the second pixel area PX2 includes the first layer to thus prevent the transistors from being changed by the infrared light.

Further, the second region DA2 includes the transmission area TA2 as well as the second pixel area PX2, so transmittance of beams output from and received by the optical member, particularly the sensing module, may be high.

Accordingly, the recognition rate or the sensing accuracy on the object to be recognized by the optical member may increase.

Referring to FIG. 11 and FIG. 12, the first pixel area PX1 may include the plurality of transistors T1 to T7 and the capacitor Cst. Part of the first pixel area PX1 may overlap the first layer 30. The first layer 30 has conductivity, and it may include various conductive metals or a semiconductor material with a conductive characteristic corresponding to the same.

The first layer 30 may be block light output from the sensing module 500, e.g., infrared light. Both infrared light and visible light may be incident on the first layer 30. The first layer 30 may transmit visible light and block infrared light.

The first layer 30 may overlap the driving transistor T1, the third transistor T3, the fourth transistor T4, and the seventh transistor T7. The first layer 30 may overlap the driving transistor T1 that is substantially influenced by a leakage current in the first pixel area PX1, the third transistor T3, the fourth transistor T4, and the seventh transistor T7. The first layer 30 is provided in a partial region of the first pixel areas PX1, so the variation of the characteristic of the transistor due to infrared light may be prevented without substantially reducing transmittance.

When the sensing module is provided on the rear side of the display panel according to an exemplary embodiment, light output by the sensing module 500 may be partly incident on the first region DA1 as well as the second region DA2. The characteristic of the transistor may be changed or a leakage current may be generated due to the infrared light.

However, the first pixel area PX1 includes the first layer 30 partly overlapping the transistors, thereby reducing the leakage current, preventing degradation of image quality caused by the leakage current, and minimizing the change of physical property of the transistors.

To sum up, the first pixel area PX1 may overlap the first layer 30. Particularly, the first layer 30 may overlap some of the transistors that are most susceptible to changes of physical properties due to the infrared light from among a plurality of transistors included by the first pixel area PX1.

Further, the second pixel area PX2 may include the first layer 30 overlapping the plurality of transistors and the capacitor. Regarding the second pixel area PX2, the infrared light may be output from the rear side of the display panel and characteristics of the transistors may be influenced by the infrared light. However, the second pixel area PX2 includes the first layer 30 to prevent the physical property of the transistor from being changed by the infrared light.

Further, the second region DA2 includes the transmission area TA2 as well as the second pixel area PX2, so transmittance of beams output from an incident on the optical member, particularly the sensing module 500, may be high. Accordingly, the recognition rate or the sensing accuracy on the object to be recognized by the optical member may increase.

A second pixel area according to an exemplary embodiment will now be described with reference to FIG. 13 to FIG. 16. The first pixel area according to an exemplary embodiment corresponds to the description provided with reference to FIG. 3 and FIG. 4, and the transmission area corresponds to the description provided with reference to FIG. 8, which will not be described.

Figure 13:
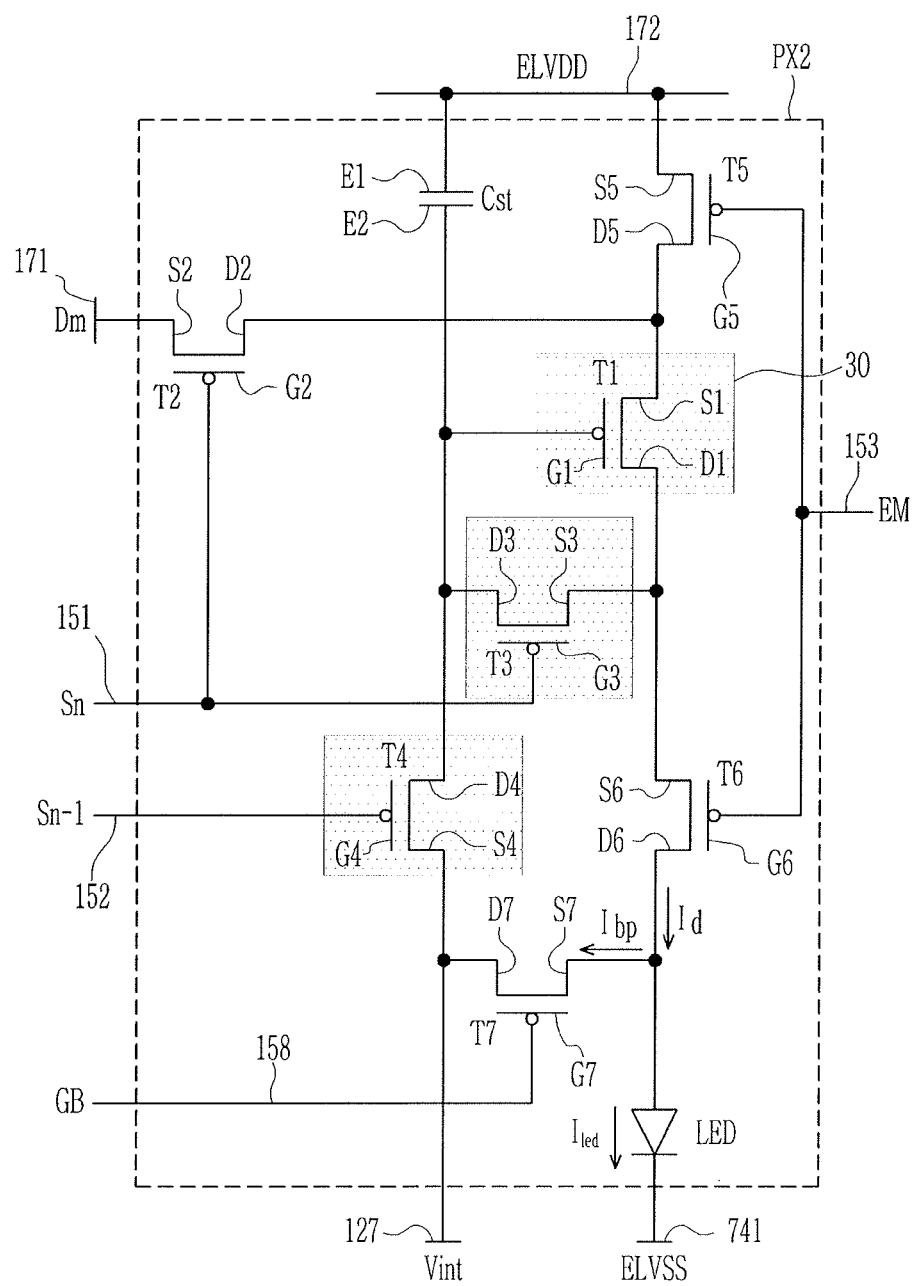
FIG. 13 illustrates a circuit diagram of a second pixel area according to an exemplary embodiment.
Figure 14:
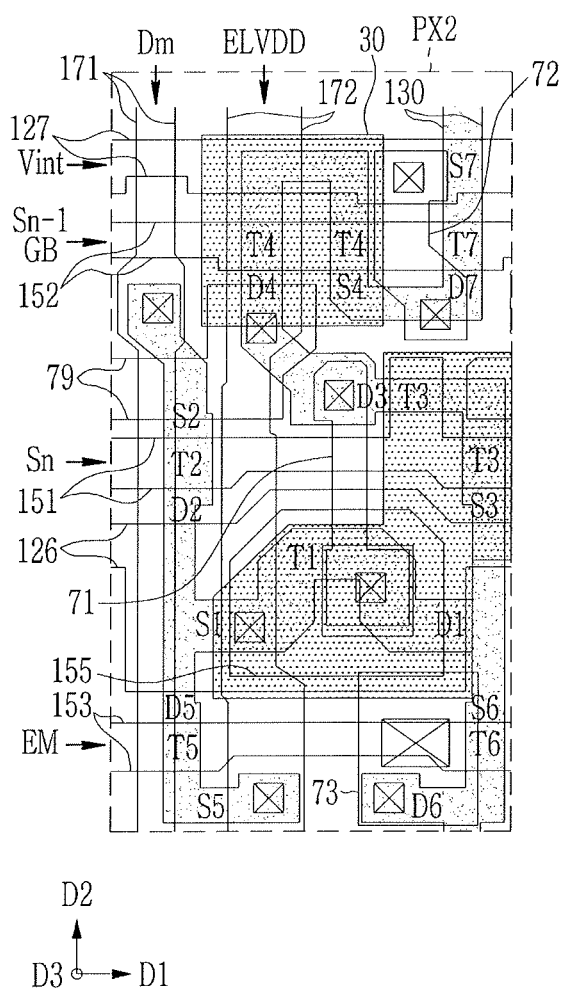
FIG. 14 illustrates a top plan view of a second pixel area of FIG. 13.
Figure 15:
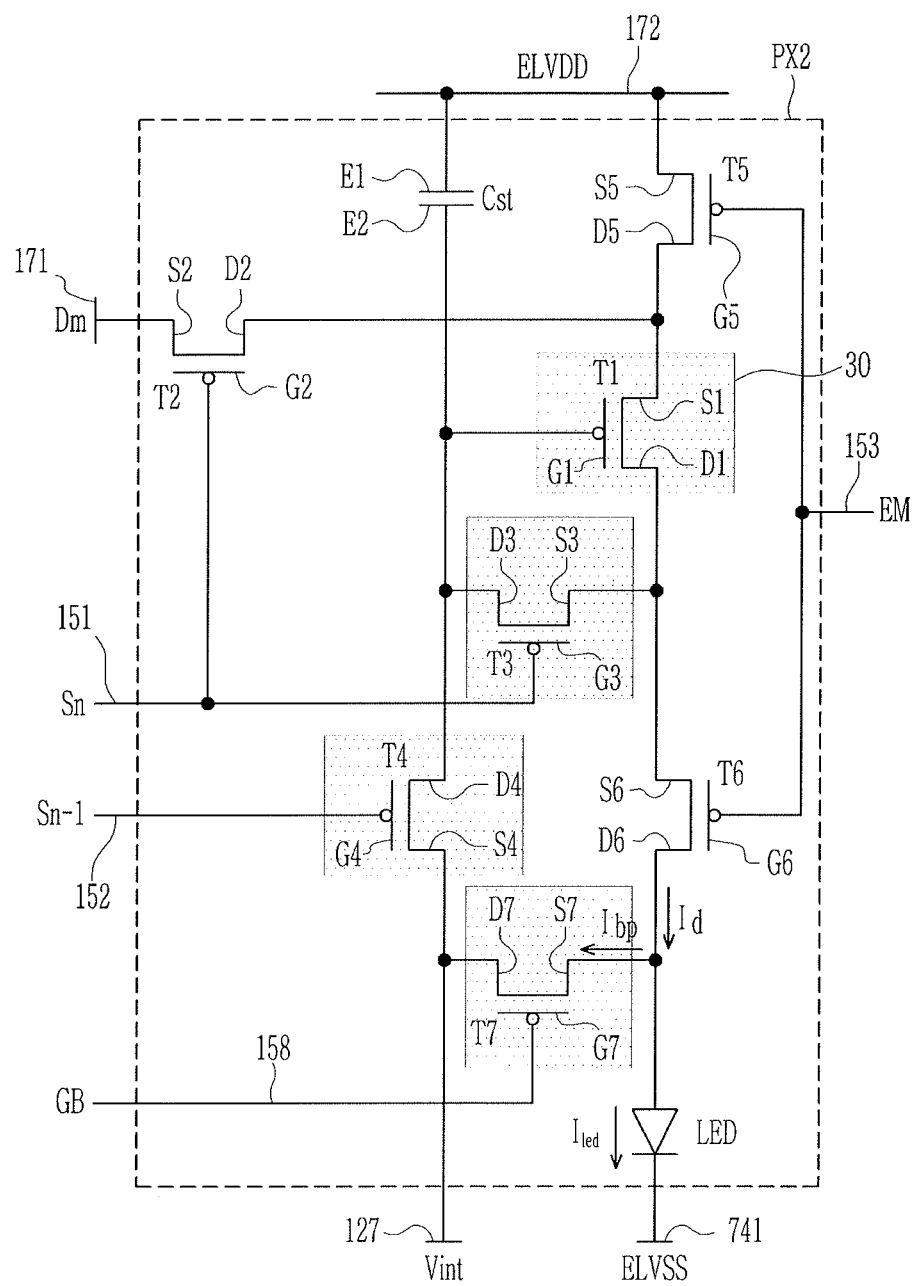
FIG. 15 illustrates a circuit diagram of a second pixel area according to an exemplary embodiment.
Figure 16:
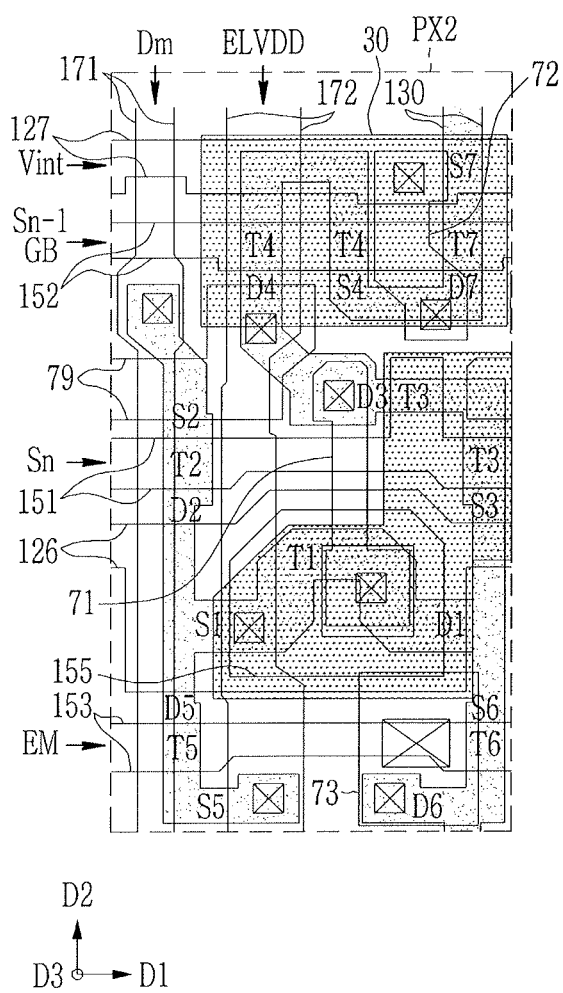
FIG. 16 illustrates a top plan view of a second pixel area of FIG. 15.

FIG. 13 shows a circuit diagram of a second pixel area according to an exemplary embodiment, and FIG. 14 shows a top plan view of a second pixel area of FIG. 13. FIG. 15 shows a circuit diagram of a second pixel area according to an exemplary embodiment, and FIG. 16 shows a top plan view of a second pixel area of FIG. 15.

Referring to FIG. 13 and FIG. 14, the second pixel area PX2 according to an exemplary embodiment may include the plurality of transistors T1 to T7 and the capacitor Cst. In this instance, part of the second pixel area PX2 may overlap the first layer 30. The first layer 30 is conductive and may include various conductive metals or a semiconductor material with a conductive characteristic corresponding to the same.

The first layer 30 blocks light output from the sensing module 500, e.g., infrared light. Both infrared light and visible light may be incident on the first layer 30. The first layer 30 may transmit visible light and block infrared light.

The first layer 30 may overlap the driving transistor T1, the third transistor T3, and the compensation transistor T4. The first layer 30 overlaps the driving transistor T1 that is substantially influenced by a leakage current in the second pixel area PX2, the third transistor T3, and the fourth transistor T4, thereby preventing the change of the characteristic of the transistor caused by transmission of the infrared light without substantially reducing transmittance of the infrared light.

To sum up, part of the second pixel area PX2 according to an exemplary embodiment may overlap the first layer 30. Particularly, the first layer 30 may overlap some of the transistors that are most susceptible to changes in physical properties due to the infrared light from among a plurality of transistors included by the second pixel area PX2.

The first pixel area PX1 has substantially the same arrangement as the second pixel area PX2, but may not overlap the first layer 30. Further, the second region DA2 includes the second pixel area PX2 and the transmission area TA2, so transmittance of beams output from the optical member, particularly the sensing module, may be high. Accordingly, the recognition rate or the sensing accuracy on the object to be recognized by the optical member may increase.

Referring to FIG. 15 and FIG. 16, the second pixel area PX2 may include a plurality of transistors T1 to T7 and a capacitor Cst.

In this instance, part of the second pixel area PX2 may overlap the first layer 30. The first layer 30 is conductive and may include various conductive metals or a semiconductor material with a conductive characteristic corresponding to the same.

The first layer 30 blocks the light output from the sensing module 500, e.g., infrared light. Both infrared light and visible light may be incident on the first layer 30. The first layer 30 may transmit visible light and block infrared light.

The first layer 30 overlapping the second pixel area PX2 according to an exemplary embodiment may overlap the driving transistor T1, the third transistor T3, the fourth transistor T4, and the seventh transistor T7. The first layer 30 overlaps the driving transistor T1 that is substantially influenced by a leakage current in the second pixel area PX2, the third transistor T3, the fourth transistor T4, and the seventh transistor T7, thereby preventing the change of the characteristic of the transistor caused by transmission of the infrared light without substantially reducing transmittance of the infrared light.

To sum up, part of the second pixel area PX2 may overlap the first layer 30. Particularly, the first layer 30 may overlap some of the transistors that may cause that are most susceptible to changes in physical properties due to the infrared light from among a plurality of transistors included by the second pixel area PX2.

The first pixel area PX1 has substantially the same arrangement as the second pixel area PX2, but may not overlap the first layer 30. Further, the second region DA2 includes the second pixel area PX2 and the transmission area TA2, so transmittance of beams output from the optical member, particularly the sensing module, may be high. Accordingly, the recognition rate or the sensing accuracy on the object to be recognized by the optical member may increase.

When a first layer is included according to an exemplary embodiment, a load of one pixel area may increase or signal distortion caused by coupling between the first layer and other signal wires may be generated. However, when the first layer is provided in the second pixel area overlapping the sensing module and the first layer is selectively provided in the first pixel area according to an exemplary embodiment, the change of image quality caused by the infrared light is reduced in the second pixel area and predetermined image quality in the first pixel area is provided, thereby providing the display device with excellent display quality.

According to the exemplary embodiments, the display device includes the sensing module provided on the rear side of the display panel, thereby providing the front display device. Further, the pixel area overlapping the sensing module includes a first layer that blocks light output by the sensing module, thereby minimizing changes in image quality caused by light output by the sensing module and providing the quality-improved display device.

One or more embodiments may provide a front display device including a sensing module provided on a rear side of a display panel. One or more embodiments may prevent a change of image quality caused by a sensing module by allowing a pixel area overlapping the sensing module to include a first layer that blocks light output from the sensing module.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display panel including a first region and a second region, wherein
the first region includes a first pixel area to display an image, and
the second region includes a second pixel area to display the image and a transmission area to transmit light,
the second pixel area includes
a first transistor,
a second transistor electrically connected to the first transistor and electrically connected to a first scan line, and
a third transistor electrically connected to the first scan line,
the second pixel area includes a first layer overlapping the first transistor and the third transistor, and the first layer is disposed below the first transistor, the first layer overlaps the first scan line in a plan view, and
the first layer has conductivity,
wherein the first layer does not overlap the second transistor.

2. The display device as claimed in claim 1, wherein:
the second pixel area includes a plurality of transistors, the plurality of transistors including the first transistor, the second transistor, and the third transistor,
the first layer overlaps only part of the plurality of transistors, and
the transmission area does not overlap the first layer.

3. The display device as claimed in claim 1, further comprising
a sensing module on a rear side of the display panel, and
wherein the light is output by the sensing module.

4. The display device as claimed in claim 1, wherein the transmission area is separated from the first layer in a plan view.

5. The display device as claimed in claim 1, wherein the first pixel area is separated from the first layer in a plan view.

6. The display device as claimed in claim 1,
the second pixel area includes a plurality of first layers, and
the plurality of first layers are separated from each other in a plan view.

7. The display device as claimed in claim 1,
wherein the first layer is separated from the second transistor in a plan view.

8. The display device as claimed in claim 1, wherein:
the first pixel area includes a plurality of transistors, and
the first layer overlaps a part of the plurality of transistors in the first pixel area.

9. The display device as claimed in claim 8, wherein:
overlap percentages of a plurality of first layers in the first pixel area and a plurality of first layers in the second pixel area are different with respect to the first pixel area and the second pixel area having a same area.

10. A display device, comprising:
a display panel including a first region and a second region, wherein
the first region includes a first pixel area to display an image, and
the second region includes a second pixel area to display the image and a transmission area to transmit light,
the second pixel area includes
a first transistor,
a second transistor electrically connected to the first transistor and electrically connected to a first scan line, and
a third transistor electrically connected to the first scan line,
the second pixel area includes a first layer overlapping the first transistor and the third transistor,
the first layer overlaps the first scan line in a plan view,
the first pixel area includes a plurality of transistors, and
the first layer does not overlap the plurality of transistors.

* * * * *